US006967152B1

(12) United States Patent
Jordan et al.

(10) Patent No.: US 6,967,152 B1
(45) Date of Patent: Nov. 22, 2005

(54) MULTILEVEL ELECTRONIC CIRCUIT AND METHOD OF MAKING THE SAME

(75) Inventors: Phillip L. Jordan, Sultan, WA (US);
John P. Yarno, Snohomish, WA (US);
Jeffery A. Strole, Ellensburg, WA (US);
Mikhail P. Bak, Seattle, WA (US);
Joseph R. Ketterl, Seattle, WA (US)

(73) Assignee: MicroConnex Corp., Snoqualmie, WA (US)

( * ) Notice: Subject to any disclaimer, the term of this patent is extended or adjusted under 35 U.S.C. 154(b) by 0 days.

(21) Appl. No.: 10/686,315

(22) Filed: Oct. 15, 2003

(51) Int. Cl.[7] .......................................... H01L 21/44
(52) U.S. Cl. ..................................... 438/597; 438/672
(58) Field of Search ........................ 29/831, 846, 847,
29/852; 257/734; 438/597, 667–669, 672,
438/678, 679

(56) References Cited

U.S. PATENT DOCUMENTS

| 6,031,286 A | 2/2000 | Levine et al. ............... 257/714 |
| 6,049,975 A | 4/2000 | Clayton ....................... 29/832 |
| 6,354,000 B1 | 3/2002 | Ross et al. ................... 29/852 |
| 6,406,939 B1 * | 6/2002 | Lin ............................. 438/108 |
| 6,414,361 B2 | 7/2002 | Wong et al. ................. 257/374 |
| 6,417,027 B1 | 7/2002 | Akram ........................ 438/109 |
| RE37,865 E | 10/2002 | Dennison ..................... 437/195 |

OTHER PUBLICATIONS

NanoNexus, www.nanonexus.com/pages/products, Nov. 8, 2002, "Cost Effective Electrical Connections For Advanced IC's".

* cited by examiner

Primary Examiner—Asok Kumar Sarkar
(74) Attorney, Agent, or Firm—Law Office of Timothy E. Siegel; Timothy E. Siegel

(57) ABSTRACT

A method of producing a multi-level electronic device that begins with machining into a sheet of dielectric material from a surface to create a set of first indentations at a first level. Conductive material is then deposited into the first indentations to create a set of first conductive features. The first indentations are then substantially filled with dielectric material. The process is continued by machining again into the sheet of dielectric material from a surface and thereby creating a set of second indentations at a second level. Further conductive material is deposited into the second indentations to create a set of second conductive features.

12 Claims, 9 Drawing Sheets

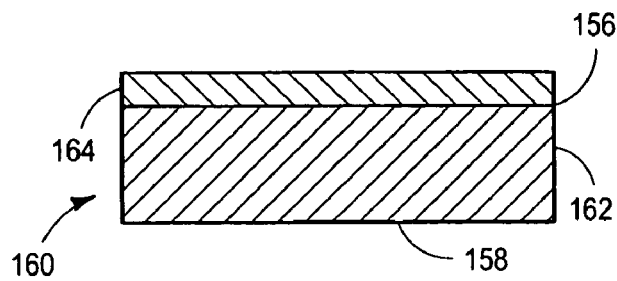
FIG. 5A
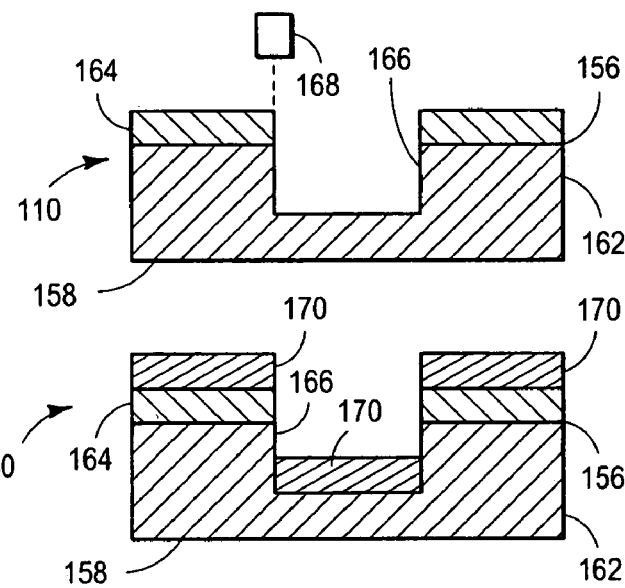
FIG. 5B
FIG. 5C
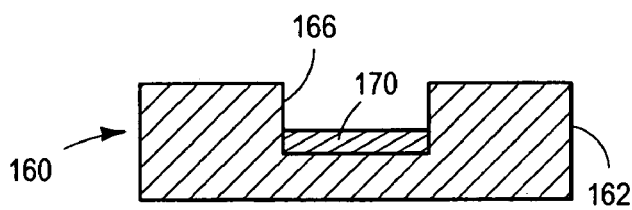
FIG. 5D
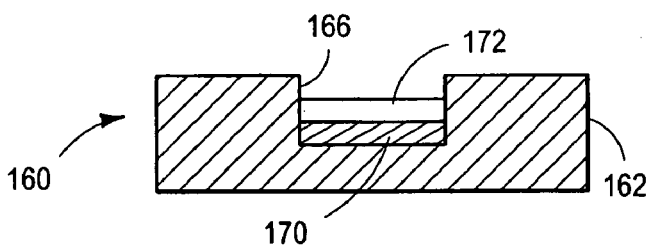
FIG. 5E
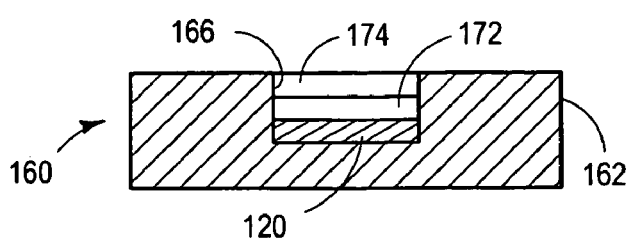
FIG. 5F

MULTILEVEL ELECTRONIC CIRCUIT AND METHOD OF MAKING THE SAME

STATEMENT OF GOVERNMENT SUPPORT

The present invention was reduced to practice, in part, with government support under grant number 2R44 NS040647-02. The United States Government has certain rights in the invention.

BACKGROUND OF THE INVENTION

The present invention relates to a method for making a flexible electrical connective device having multiple levels of conductive paths or any similar multi-layer electrical device. One type of such a device includes an array of conductive pads on at least one major surface. These conductive pads may be each connected to one of a more widely spaced array of connective tabs along the sides of the device. There are many applications for this type of device. For example, such a device may be used to provide a rectilinear array of pads for testing of ball grid array (BGA) modules or circuit boards with BGA interconnect patterns that are too small to be tested by conventional pin probe testers. Another application is to provide for interconnection to a similarly patterned array of independently connectable electrical contact pads in an electrically stimulated array. The requirement that the electrical contact pads be independently connectable creates a conductive path routing and cross-talk suppression challenge.

One use for a planar array of independently connectable electrical contact pads is for electrical stimulation of, and electrical reception from, an ultrasound array. For a more complete description of the requirements for a connector to an ultrasound array, please see U.S. Pat. No. 5,855,049, issued Jan. 5, 1999, which is hereby incorporated by reference as if fully set forth herein. As noted in this reference, it is typical to use a flex circuit electrical contact pad array for the purpose of electrically connecting an ultrasound array to take advantage of the acoustical and mechanical characteristics of a flex circuit. A flex circuit can permit a full set of connections without suffering the effects of the gaps that can be created by slight non-uniformities between two rigid surfaces. In addition, the flex circuit can be flexibly routed to connect the array to external circuit boards or cabling.

A flexible array of electrical contacts also proves useful in the stimulation of a set of nerve cells in an animal body or in serving as a conductive link for the recording of nerve impulses from a set of nerve cells. Among the bodily sites having an array of nerve cells that may require stimulation are the retina and the nerves that stimulate the muscles. In addition, the cochlea, an organ of the inner ear that translates sound waves into electric nerve impulses may host a cochlear implant. This type of implant, which stimulates cochlear nerve endings in people for whom the hearing train has been severed so that sound waves do not stimulate the auditory nerves, has been available for many years. There is a continuing effort, however, to increase the density of electrodes in cochlear implants and other electrical implants, in order to effect a more complete sensory or stimulation restoration. Along these lines, a method of constructing a flexible planar array of electrodes that is thinner than was heretofore available may prove very helpful. Other medical applications include providing an array of contacts for a biochemical or other biophysical sensing system.

Another use for an array of independently connectable electrical contact pads is for attachment to the terminals of an integrated circuit (IC) die. IC dies are typically produced having a set of terminals along the periphery of the die and with the terminals mutually spaced apart by 50 to 100 microns. The die is typically placed in a package to form an outside interconnect pitch of 1.27 mm or smaller, for connection to a PCB. The IC die terminals are typically connected to an intermediate chip scale package circuit by means of wire bonding or by flip chip mounting to a flex circuit that expands outwardly from the die perimeter to a larger rectilinear array. The principle reason why the IC die terminals are arranged solely along the perimeter of the IC die is because of the limitations of wire bonding and flex circuit manufacturing technology. If a flex circuit having a partial or full rectilinear array of interconnect pads with a pitch on the order of tens of microns could be efficiently produced, this would permit IC dies to be produced having terminals in a matching array, thereby permitting more terminals into and out of the IC, a highly desirable goal.

IC wafer test provides another area of application for a flex circuit with an array of conductive contact pads. Before the IC wafer is diced there is no periphery for each individual IC, for electrical connections to be made. Consequently, all electrical connections must be made along the planar surfaces of the IC. Accordingly, a flex circuit bearing a planar array of contacts, because it has the flexibility to forgive protrusional variations, is the ideal mechanism for forming a number of such planar electrical contacts simultaneously.

Yet another application for a planar array of independently connectable electrical contact pads, is in the testing of PCBs. It is highly desirable to test a PCB after production but prior to connecting circuitry to the PCB. If a flaw in the PCB is discovered after circuitry has been connected to the PCB, the entire circuit must typically be discarded. For a PCB having a tightly pitched array of terminals for connecting to a ball grid array, however, it may be extremely difficult to form a test connector that independently contacts each one of these terminals. It would, therefore, be highly desirable to have a tightly packed planar array of independently connectable electrical contact pads for the purpose of forming a test connector for a PCB bearing tightly packed arrays of electrical contact pad contacts or to convert the tightly pitched array of terminals to a less tightly packed array which can be tested by conventional means. In addition, a tightly packed planar array of electrical contact pads can also be used to test the ball grid array IC circuit itself.

One method used to construct planar arrays of independently connectable electrical contact pads is known as the "thin film\wet chemistry" process of building up a flex circuit layer by layer. Each dielectric layer is spin coated on to the top of the previously created laminate structure, then drilled or etched, plated and patterned. For via interconnects, a pad is first formed on a deposited layer for connection to the prospective next layer to be deposited. After the next layer is deposited a blind via is drilled to the underlying pad, followed by plating and patterning of a pad directly over the via, forming an electrical connection to the pad below. The disadvantages of this method are that it is expensive and a mistake on any layer can ruin the entire flex circuit. The process of spin coating a patterned layer is also somewhat problematic as the spin coating must be applied to at least a minimum thickness for the certain covering of all electrical features, thereby setting a minimum thickness for the finished multilevel circuit.

Another traditional method to construct planar arrays of independently connectable electrical contact pads has been to join together conductively patterned dielectric layers each having mutually co-located connective pads. Individual patterned dielectric layers are first bonded together, typically through an intermediate dielectric, followed by via drilling and plating through the mutually co-located electrical contact pad pads to connect one layer to the next. Typically the connective paths are patterned to allow through-hole drilling to connect layers. As additional layers are added they are drilled and plated to form connections. There are two principle problems associated with this method. First, many process steps are involved to drill and plate the various layers. Second, the accuracy required to align the various layers and successfully drill and plate to connect them severely limits the array density. If through-hole drilling instead of blind vias are used to connect layers, the traces must be routed so as to avoid drilling through traces running above or below the layer to be connected, further limiting the array density.

Yet an additional method of constructing an array of contact pads interconnected through a multilayer structure involves laminating patterned circuits together using anisotropic or z-axis adhesives which connect conductive portions of the individual layers together without forming a conductive short to neighboring traces. A disadvantage of this approach is the additional complexity involved in laying out the conductive circuit patterns as well as the higher cost and uncertain reliability of the anisotropic connective approach.

U.S. Pat. No. 6,354,000, issued on Mar. 12, 2002, addresses many of the concerns noted above. This patent describes a process in which a stack of layers bearing conductive paths are electrically connected to a top layer bearing an array of electrical contact pads by drilling and plating connective vias. Although this technique represents a great advance over the prior art, some problems have arisen in the implementation of this method of construction. For example, the patterned sheets may tend to warp during lamination. Also, it is a challenge to drill through several layers without drilling through a conductor on a layer interposed between the drilling surface and the target conductive path. In addition, some target conductive paths may be by necessity very thin, on the order of microns, presenting a challenge to one attempting to accurately drill a via to the target conductive path. One more problem is posed by the possibility of a trace piercing and adjacent dielectric layer and thereby contacting a trace on the adjacent layer. This potential problem necessitates the use of thicker dielectric layers than would otherwise be necessary, thereby forcing a greater thickness for the device as a whole.

A problem that is faced by those practicing any one of the techniques described above is that of completely electrically isolating traces from one another. In the case of traces that are on the same level, imperfections in photolithographic technique can cause traces to effectively extend farther transversely than the ideal trace extent indicated by the mask. These unintended "shoulders" force a sparser design than would be otherwise possible, to avoid unintended trace contact. Another type of unwanted trace contact may occur between the traces on the bottom of a first lamina and the traces on the top of a second lamina that is positioned directly beneath the first lamina. To avoid this type of contact, it is necessary to use an adhesive thickness (in joining the two lamina) that includes an error budget for uneven adhesive thickness and uneven trace thickness. Alternatively, a product that is a sheet of material that is tough on the inside but malleable on the outside may be used. Both techniques, again, reduce circuit density.

The present invention addresses these limitations as described below.

SUMMARY

In a first separate aspect, the present invention is a method of producing a multilevel electronic device that begins with machining into a sheet of dielectric material from a surface to create a set of first indentations at a first level. Conductive material is deposited into the first indentations to create a set of first conductive features. The first indentations are then substantially filled with dielectric material. The process is continued by machining again into the sheet of dielectric material from a surface and thereby creating a set of second indentations at a second level. Further conductive material is deposited into the second indentations to create a set of second conductive features.

In a second separate aspect, the present invention is a method for creating a vertical planar conductive feature in an electrical device work piece having a major horizontal top surface. The method begins with the step of machining through the major horizontal top surface, to create a trench. Then at least a portion of the trench is plated on at least one side with conductive material, thereby creating a vertical planar conductive feature.

The foregoing and other objectives, features and advantages of the invention will be more readily understood upon consideration of the following detailed description of the invention, taken in conjunction with the accompanying drawings.

BRIEF DESCRIPTION OF THE DRAWINGS

FIG. 5A shows a side sectional view of the work piece of FIG. 1A, with photo resist laminated to the top, as part of a more detailed depiction of a particular method for implementing a portion of the process of FIGS. 1A–1E.

FIG. 5B shows a side sectional view of the work piece of FIG. 5A, in the context of a laser ablating a portion of the work piece.

FIG. 5C shows a side sectional view of the work piece of FIG. 5B, with a conductive seed layer added.

FIG. 5D shows a side sectional view of the work piece of FIG. 5C, with undesired layers removed.

FIG. 5E shows a side sectional view of the work piece of FIG. 5D, with plating added to seed layer.

FIG. 5F shows a side sectional view of the work piece of FIG. 5D, with a dielectric layer added to the plated seed layer.

DETAILED DESCRIPTION OF THE PREFERRED EMBODIMENTS

Figure 1A:
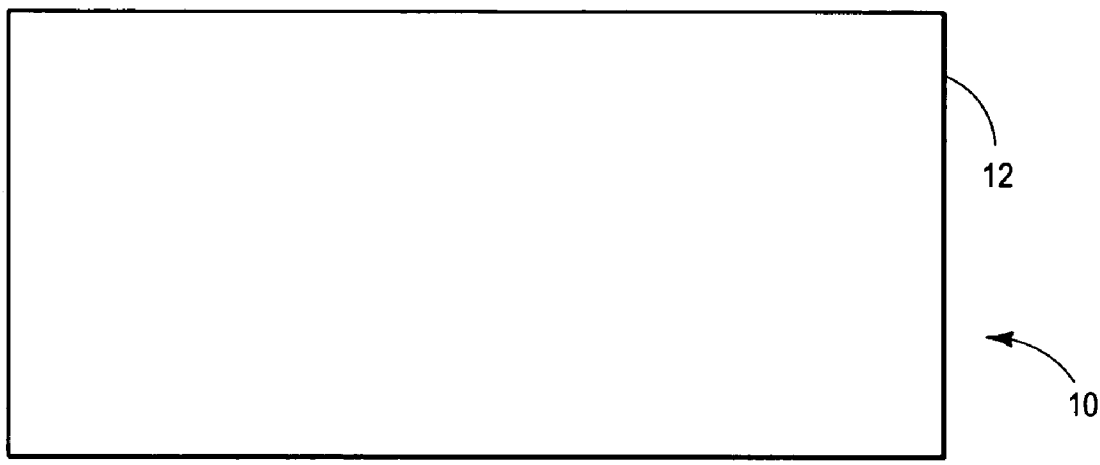
FIG. 1A shows a side view of a work piece used in the process of the present invention.
Figure 1B:
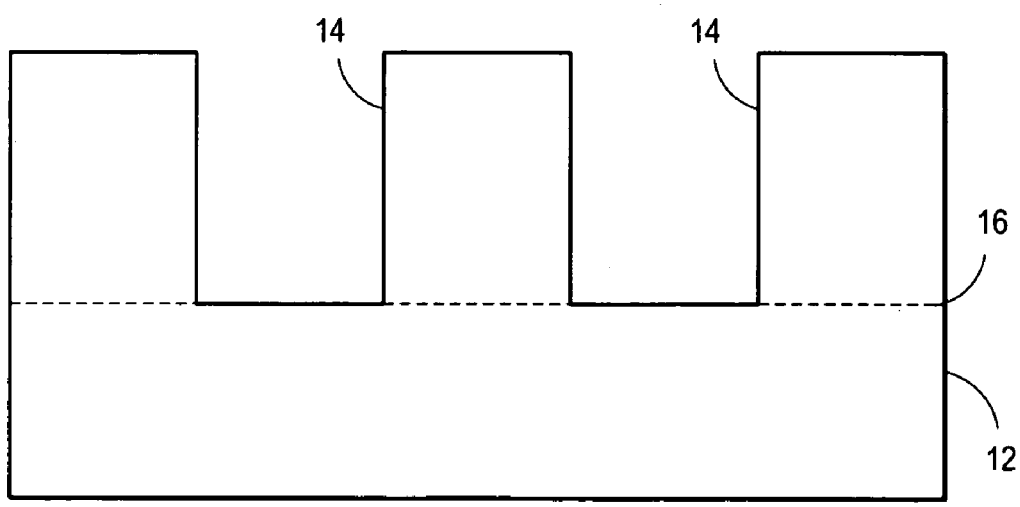
FIG. 1B shows a side sectional view of the work piece of FIG. 1A, but having trenches formed in it, representing a further stage in the process of the present invention.
Figure 1C:
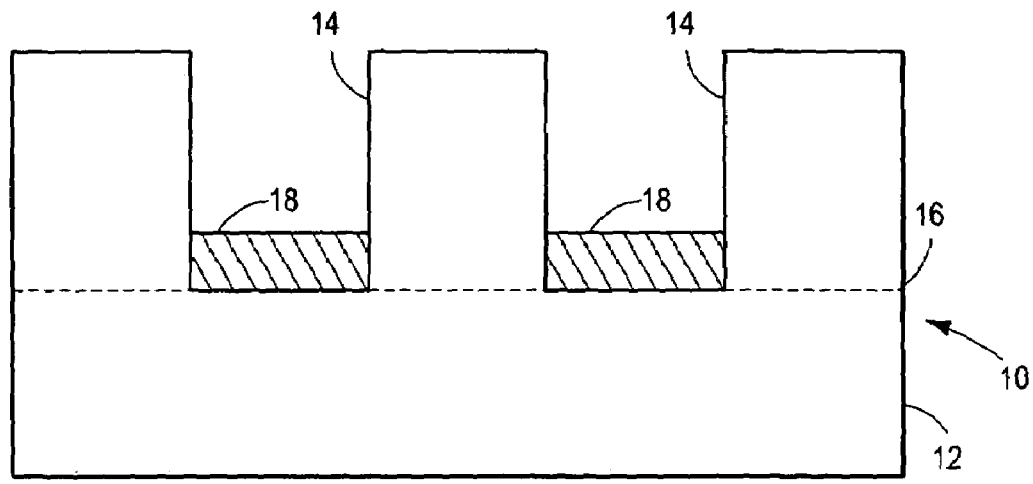
FIG. 1C shows a side sectional view of the work piece of FIG. 1B, having plating deposited in the trenches, representing a further stage in the process of the present invention.
Figure 1D:
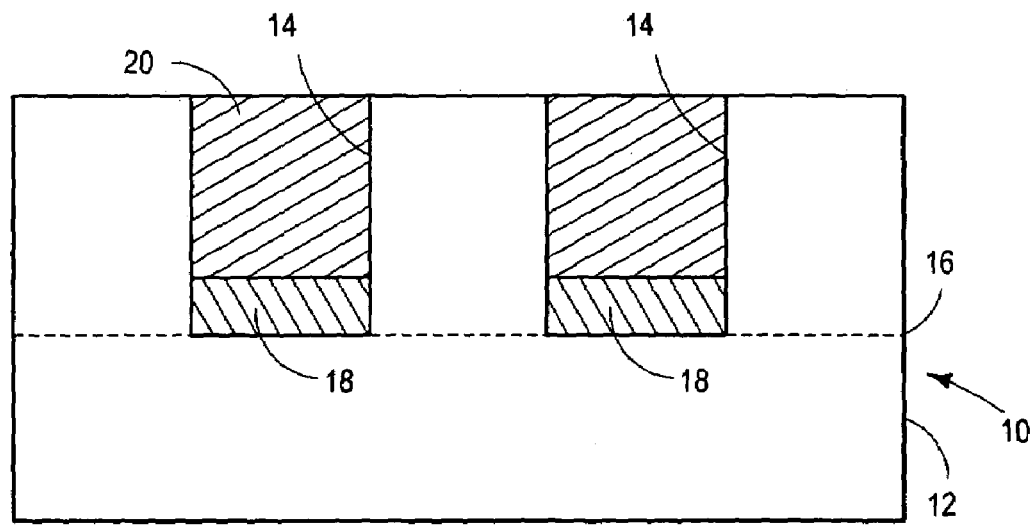
FIG. 1D shows a side sectional view of the work piece of FIG. 1C, with the trenches filled with dielectric material, representing a further stage in the process of the present invention.
Figure 1E:
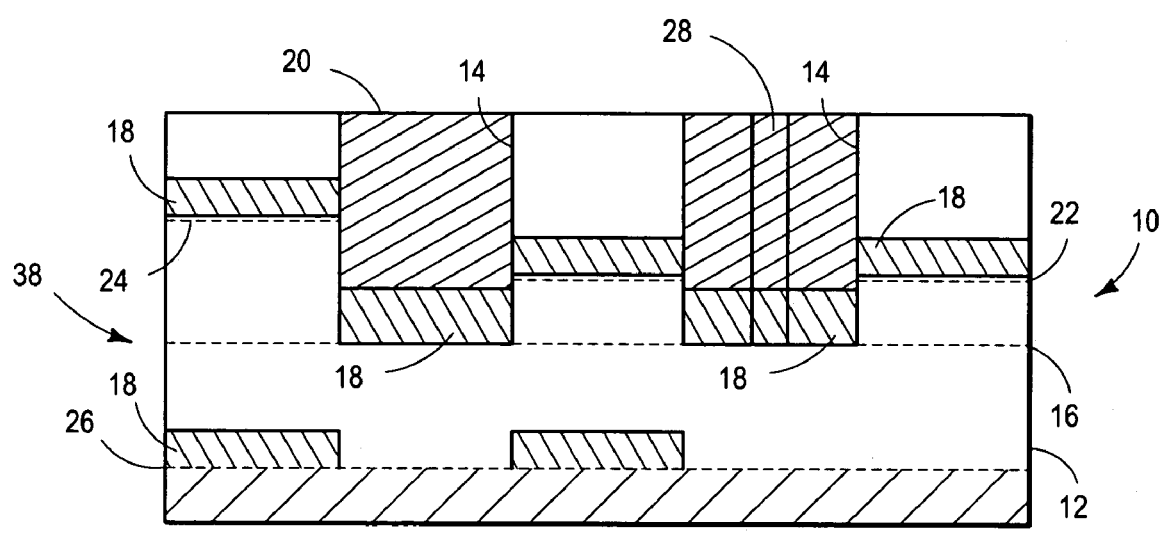
FIG. 1E shows a side sectional view of the work piece of FIG. 1D, with additional traces at various levels created, representing the final stage in the process of the present invention.

Referring to FIGS. 1A–1E, in brief overview one preferred method of practicing the present invention begins with a work piece 10, that at first is only a substrate 12 of dielectric material (FIG. 1A). Next (FIG. 1B), a series of trenches 14 are formed down to a first level 16 into substrate 12. Conductive material is deposited at the bottom of trenches 14, to form a set of traces 18 (FIG. 1C). The trenches 14 are then filled with a viscous liquid material, which is cured to form a dielectric covering 20 (FIG. 1D).

Work piece 10 is now a patched dielectric substrate 12 having a buried network of traces 18 at the first level 16. The process may be repeated to form a network of traces 18 at a second level 22, a third level 24, a fourth level 26 (FIG. 1E) and so on, for as many levels as will fit within the thickness of substrate 12. These traces may be connected by standard drilling and plating of vias 28, through the workpiece 10 after all the levels of traces 18 are completed, thereby forming a finished complex multilevel circuit 38. Alternatively, traces could be connected from one level to the next during the formation of each level of traces 18.

The above-described process permits a multilevel circuit to be constructed within a single substrate, thereby avoiding the problems encountered in adhering a first trace bearing dielectric sheet to a second sheet of the same type. These problems include the accurate alignment of the first and second sheets, the complete adhesion of the first and second sheets and the complete electrical isolation of the traces on a particular layer or sheet from one another (by an evenly and completely applied adhesive). Moreover, in the conventional build-up of a multilevel circuit, any warping encountered during lamination must be addressed during any post-lamination machining. As a result, because of the unpredictability of warping during lamination, to achieve a high density of features the production of "built-up" multilevel circuits requires a fair amount of human labor for each multilevel circuit constructed.

In contrast, with the method of the present invention, there is no lamination of sheets, and so in-plane dimensional stability is improved. Moreover, there is no adhesion of layers, and so no concern regarding complete adhesion. Accordingly, each trace is positively electrically isolated from its horizontally and vertically neighboring traces. Moreover, as is discussed in greater detail below, vertical planar features may be constructed with this method, creating possibilities for new types of structures in multilevel circuits. Although there would typically be more machining steps in the present method, these are more highly deterministic and, accordingly, more susceptible to automation, leading to a cost reduction for the finished product.

In greater detail, substrate 12 may be made of liquid crystal polymer, polyimide, poly tetrafluoroethylene (PTFE), silicone, or an inorganic material, such as a thin film oxide or nitride. Also, materials commonly used in the production of printed circuit boards could be used for substrate 12, such as the material given the industry designation FR4. Substrate 12 and therefore the finished product may be less than 25 microns thick. Trenches 14 may be formed by laser micromachining, photolithography and subsequent wet or plasma etching, or embossing. Laser micromachining provides flexibility in the depth of machining, permitting a gradually sloping trench 14, if desired. The viscous liquid material used to form dielectric covering 20 may be benzocyclobutane (BCB), a silicone material, polyurethane, a fluoropolymer, or a polyimide. In addition, other materials may be used to fill trenches 14. Substrate 12 may be 25 micrometers thick and traces 18 may be approximately 0.25 to 10 micrometers thick.

Figure 2A:
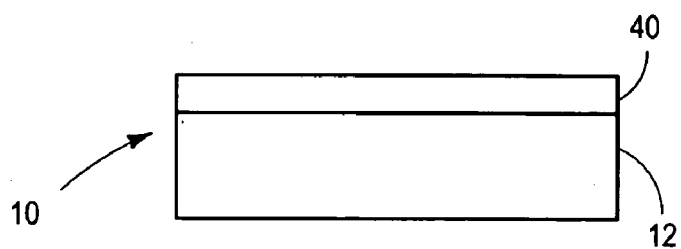
FIG. 2A shows a side sectional view of the work piece of FIG. 1A, with photo resist laminated to the top, as part of a more detailed depiction of a particular method for implementing a portion of the process of FIGS. 1A–1E.
Figure 2B:
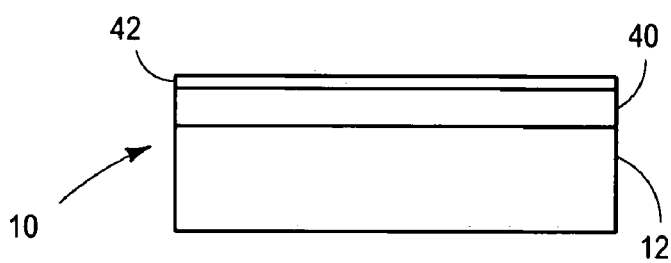
FIG. 2B shows a side sectional view of the work piece of FIG. 2A, with a fine line mask laminated to the top.
Figure 2C:
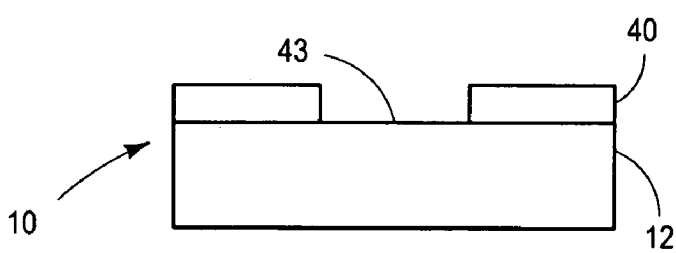
FIG. 2C shows a side sectional view of the work piece of FIG. 2B, with the fine line mask removed and the photo resist developed.
Figure 2D:
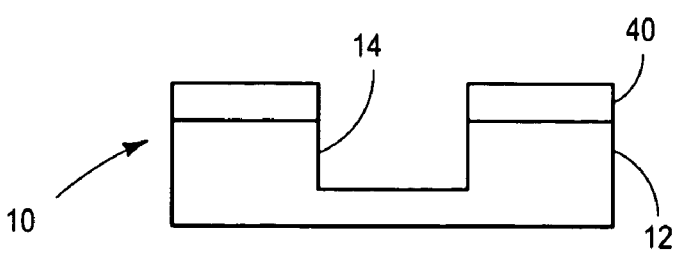
FIG. 2D shows a side sectional view of the work piece of FIG. 2C, the photo resist and substrate ablated.

FIGS. 2A–2D describe one preferred method of using photolithography to form a set of trenches 14. In a first step, shown in FIG. 2A, a layer of photoresist 40 is laminated to dielectric substrate 12. In FIG. 2B, a fine line mask 42 has been placed over photoresist layer 40 and is exposed to light. The photoresist 40 is then exposed to a solvent, which washes away the unwanted portions (FIG. 2C) to create a set of exposed areas 43, where substrate 12 is devoid of photo resist. Substrate 12 is then ablated in the exposed areas 43 either with gas plasma or with a liquid etch agent, and the remaining photoresist is stripped away (FIG. 2D). At this point the trenches 14 have been formed, and the process of creating traces 18 may begin.

The use of a liquid etch agent in the process described above poses some problem. If a solvent-based system is used, the process described is fairly easy to perform. Solvent based systems, however, appear to be encountering an increasingly strong level of resistance from governmental entities charged with protecting the environment. Unfortunately, in aqueous based systems, the aqueous based etching agent tends to remove the developed aqueous based photoresist more rapidly than it removes the substrate material 12. To avoid this problem, gas plasma etching may be used to remove portions of substrate 12.

Plasma etching has the advantage of creating trenches of an extremely uniform depth. Moreover, in general the plasma etch process is very repeatable, making the trench depth controllable as a function of time of exposure of substrate 12 to the plasma. Unfortunately, the fine line imaging described in FIGS. 2A through 2D does not lend itself well to plasma etching, as the plasma removes the photoresist as quickly or more quickly than it removes the substrate 12 material.

Figure 3A:
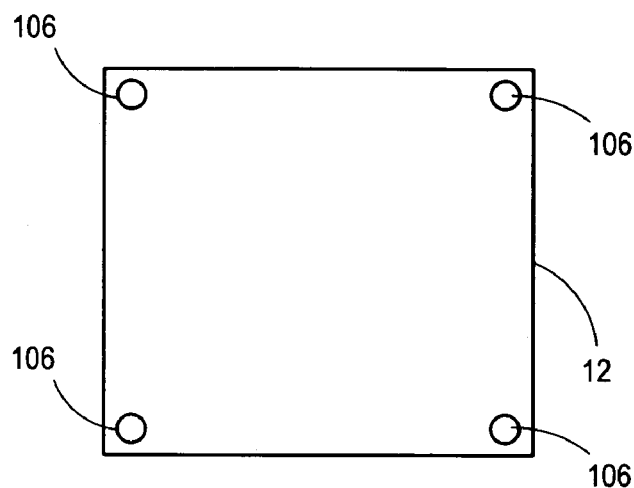
FIG. 3A shows a top view of the work piece of FIG. 1A, with tooling holes added, as part of a more detailed depiction of a particular method for implementing a portion of the process of FIGS. 1A–1E.
Figure 3B:
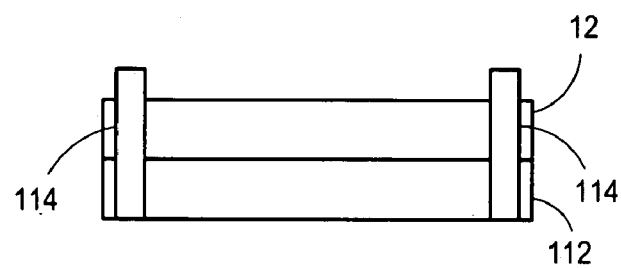
FIG. 3B shows a side sectional view of the work piece of FIG. 3A, placed onto a fixture.
Figure 3C:
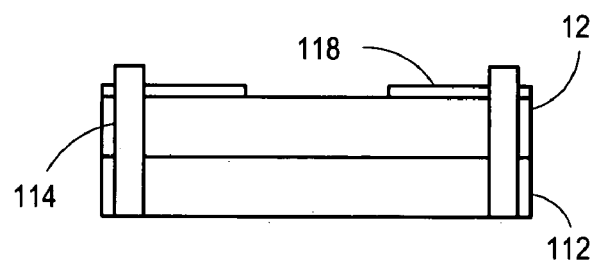
FIG. 3C shows a side sectional view of the work piece of FIG. 3A, shown with a circuit pattern placed on the fixture.
Figure 3D:
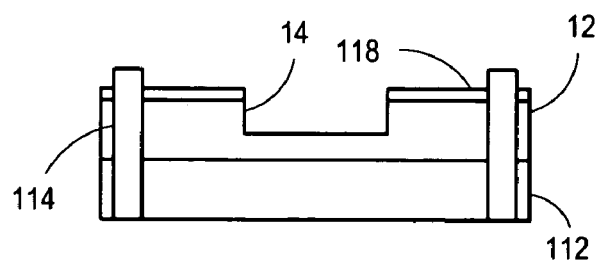
FIG. 3D shows a side sectional view of the work piece of FIG. 3A, shown with a circuit pattern placed on the fixture and the work piece ablated.

FIGS. 3A–3D show an alternative method of constructing trenches 14, which facilitates the use of a gas plasma etch. In this method, a set of tooling apertures 106 are machined through a substrate 12 (FIG. 3A). Substrate 12 is then placed on a tooling fixture 112, by threading apertures 106 over a set of fixture posts 114 (FIG. 3B). Next, a circuit pattern 118 (FIG. 3C) is threaded over posts 114 and substrate 12 is ablated (FIG. 3D), typically by plasma etching. Metal, which is unaffected by gas plasma, is the material of choice for circuit pattern 118.

In a variant of the method shown in FIGS. 3A and 3B, the circuit pattern 118 is produced in situ on substrate 12. The process begins with a sheet of copper clad dielectric of which the dielectric serves as substrate 12 and the copper cladding (other metals may be used) serves as a metal work piece for the production of a mask. Alternatively, the process starts with a substrate onto which a thin (@ 10 nm) layer is sputtered to serve as the work piece for the production of the mask. Whichever technique is used to provide a metal clad dielectric, standard lithographic techniques are used to pattern the metal in order to create a mask. A plasma etch is then performed to create trenches 14. One benefit of the in situ creation of a mask is that because it is more closely bonded to substrate 12, the plasma will not remove parts of the substrate that are underneath the metal, as may happen when a mask or circuit pattern 118 is merely placed on substrate. One drawback of the in situ creation of a mask is that the mask created can be used only once.

Figure 4A:
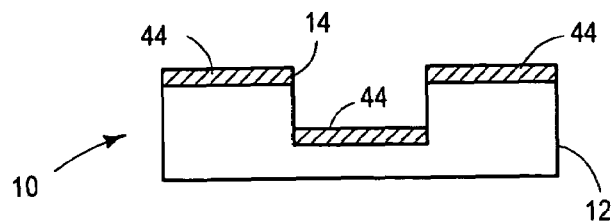
FIG. 4A shows a side sectional view of the work piece of either FIG. 2D or FIG. 3D, and further including a conductive seed layer on top of the work piece.
Figure 4B:
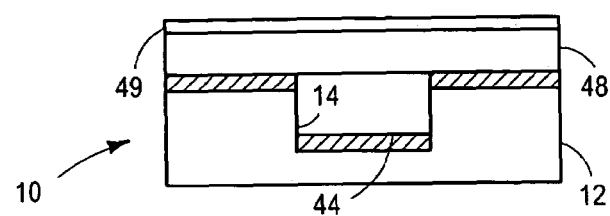
FIG. 4B shows a side sectional view of the work piece of FIG. 4A, having been laminated with photo resist and a mask.
Figure 4C:
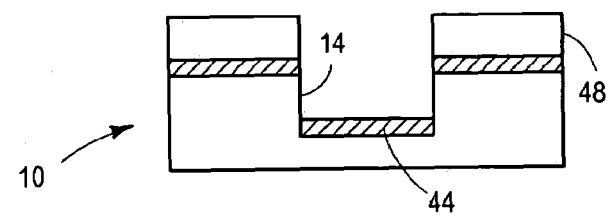
FIG. 4C shows a side sectional view of the work piece of FIG. 4B, with the mask removed and the photo resist developed.
Figure 4D:
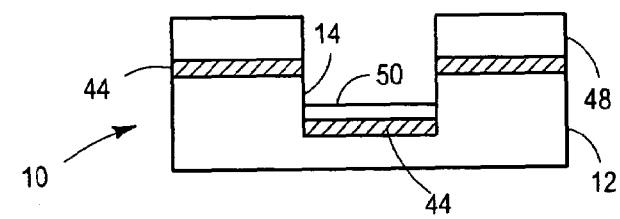
FIG. 4D shows a side sectional view of the work piece of FIG. 4C, with a plated layer added.
Figure 4E:
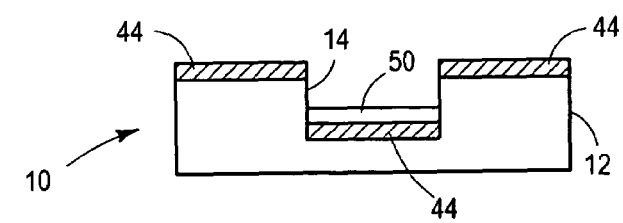
FIG. 4E shows a side sectional view of the work piece of FIG. 4D, with the photo resist removed.
Figure 4F:
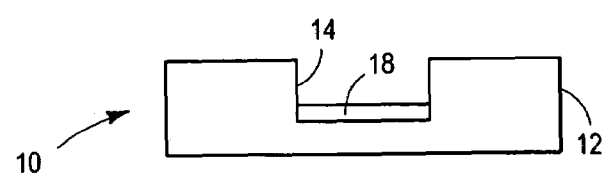
FIG. 4F shows a side sectional view of the work piece of FIG. 4E, with the seed layer removed.
Figure 4G:
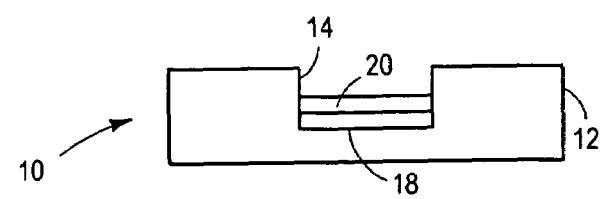
FIG. 4G shows a side sectional view of the work piece of FIG. 4F, with a dielectric layer added.

Without regard to whether the method of FIGS. 2A–2D or the method 3A–3D has been used to create trenches 14, the method shown in FIGS. 4A–4G may be used to create conductive traces 18 within the trenches 14. Referring to FIG. 4A, a seed layer 44 (typically about 5 to 250 nanometers) of conductive material, such as gold is sputtered over all of the upwardly facing surfaces of work piece 10. Sputtering is controllably directional, so if it is controlled to be strictly downward, the sides of trenches 14 will not be covered. On the other hand, if there is a desire to coat the sides of the trenches 14 as well, the sputtering can be controlled to be less directional (more isotropic). Next, (FIG. 4B) another layer of photoresist 48 is applied to workpiece 10 and is imaged and developed (FIG. 4C), coincident with trenches 14. A fineline mask 49, which may be identical to mask 42, is used for this imaging.

The exposed seed layer 44, inside the trenches 14 is then electroplated (FIG. 4D) to form a conductive plated layer 50. The electroplating of course does not occur on the covered seed layer 44, outside of trenches 14. After the electroplating is completed, the photoresist 48 is stripped away (FIG. 4E) and then a thin layer (about 100 nanometers) of conductive material 44 is removed from all upwardly facing surfaces (FIG. 4F) by means of a chemical or plasma etch. This completely removes the seed layer of conductive material 44 from the top surface of work piece 10. The conductive plated layer 50 on traces 18 is, however, far thicker and is not operatively altered by the process that strips the seed layer 44 from the other areas. Finally, trenches 14 are filled with a suitable dielectric 20, which may be liquid curable, organic or inorganic based plasma deposited, or sublimation deposited parylene.

Subsequently, new trenches 14 may be formed at a different depth in work piece 10 by either the process of 2A–2D or 3A–3D and traces may be formed in these new trenches 14 by a repetition of the process of FIGS. 4A–4G.

Referring to FIGS. 5A–5E, in another preferred method, a work piece 160, comprising a substrate 162, having a nominal top surface 156 and a nominal bottom surface 158, is coated with (laminated to) a sacrificial mask 164, made of process-removable material. Process-removable material, in the context of this application, is material that is removable by the type of process typically used to remove developed photo resist ("removal process"), that is, exposure to a removal agent, such as a solvent or a plasma. In this case, however, water or some benign aqueous solution, could be used as the removal agent for some materials. A laser 168 (FIG. 5B) is then used to form trenches 166, through both the sacrificial mask 164 and the underlying substrate 162 (FIG. 5C).

A layer of conductive material 170, typically gold or copper, is then deposited by sputtering on both the bottom of the trenches 166 and on the sacrificial mask 164, which remains on the top of substrate 162. Sacrificial mask 164 is then removed together with the portion of the sputtered layer of conductive material 170 (FIG. 5D) that overlays mask 164. Next layer 170 is used as a conductive base for electroplating, thereby creating a plated layer 172 (FIG. 5E). In order to place a charge onto layer 170 an electrical connection is made to it, either by fitting a conductor into one of trenches 166 or by designing a trench 166 that extends to a side surface of substrate 162.

Finally the unfilled portion of the trenches 166 is filled with dielectric material 174 (FIG. 5F), which may be one of the materials listed for dielectric material 20. The process is repeated, either by once again machining inwardly from the top surface 156, or by rotating work piece 160 to face laser 168 and machining inwardly from the bottom surface 158. It may be noted that the above described process need not use any photo resist, although sacrificial mask 164 could be photo resist.

Although sacrificial mask 164 need not be transformed by exposure to light, photo resist material is so widely used and readily available that some method users may choose to use a photo resist for sacrificial mask 164. The fact that material 164 need not have photo resist properties, however, opens up a wide range of materials, some of which may be more environmentally harmless than currently used photo resist materials.

Figure 6A:
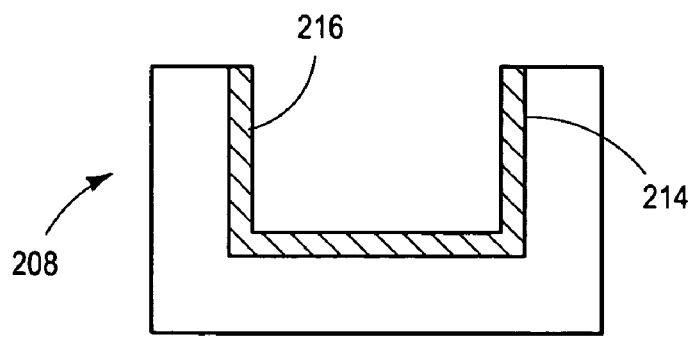
FIG. 6A shows a side sectional view of a work piece, including a plated trench that is being used to construct a shielded trace according to the present invention.

As noted in the discussion of step 5E, it is possible to make the sputtering less directional, thereby coating the sides, or a portion of the sides of one of the trenches 166. Referring to FIGS. 6A–6D, in one preferred embodiment, this technique is used to form a shielded conductive trace 220 (FIG. 6D). First a trench 214 is formed in a work piece 208, the bottom and sides of which are plated with conductive material 216 (FIG. 6A).

Figure 6B:
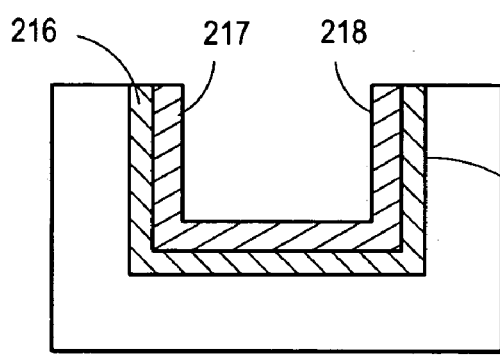
FIG. 6B shows a side sectional view of the work piece of FIG. 6A, showing dielectric material added to the trench and a nested trench in this dielectric material.
Figure 6C:
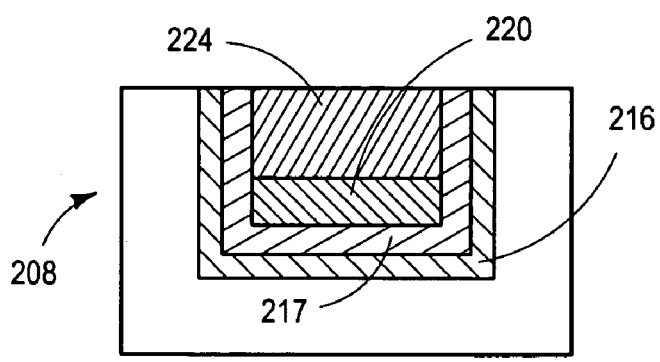
FIG. 6C shows a side sectional view of the work piece of FIG. 6B, showing a trace in the nested trench and dielectric material added over the trace.
Figure 6D:
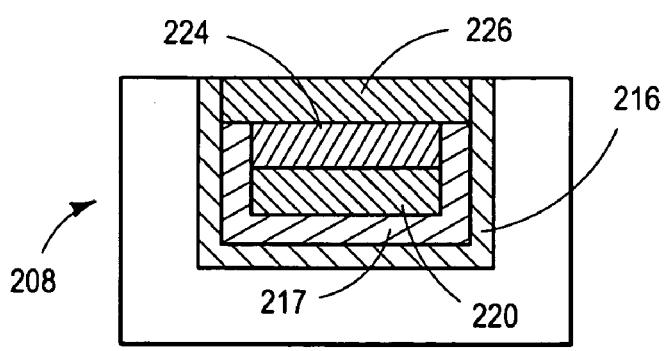
FIG. 6D shows the work piece of FIG. 6C, having a finished shielded trace.

Plated trench 214 is then filled with dielectric material 217 that is then machined to form a nested trench 218 (FIG. 6B). A nested trench trace 220 (FIG. 6C) of conductive material is formed in nested trench 218. Trace 220 is formed only on the bottom of nested trench 218 so that trace 220 can be more easily electrically isolated. Dielectric material 224 is then deposited on top of trace 220, forming with material 217 a closed channel of dielectric material surrounding trace 220 (FIG. 6C).

Finally, an upper portion of material 217 and 224 is removed and an upper plating 226 (FIG. 6D) is formed, which electrically contacts plating 216, together forming a closed channel of conductive material that shields trace 220, avoiding cross-talk from any neighboring traces or environmental electromagnetic interference. Other uses for vertical planar features may be possible.

Figure 7:
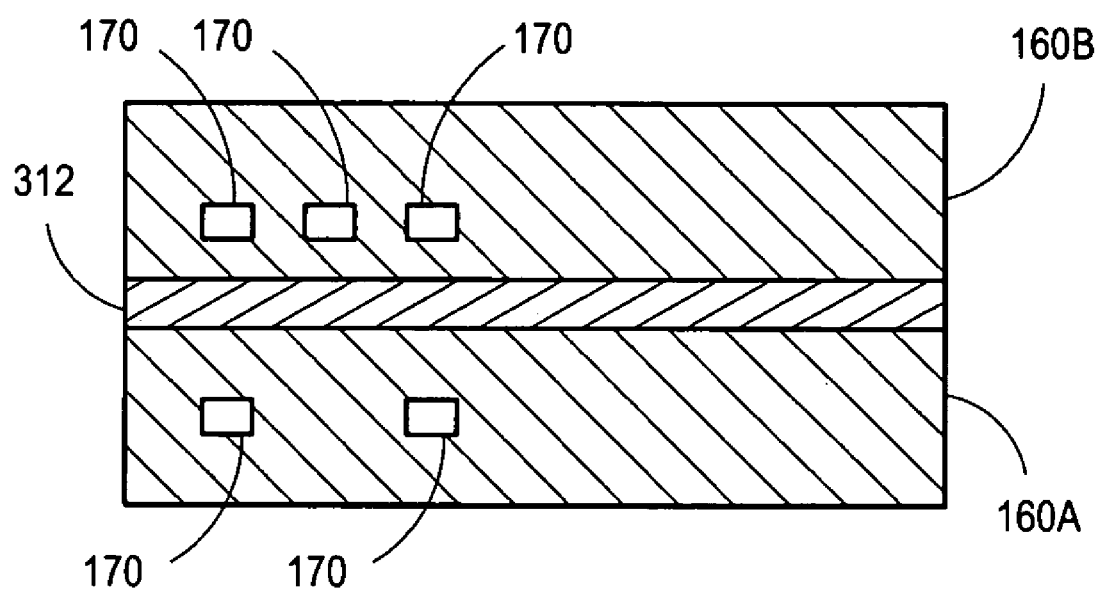
FIG. 7 shows a side sectional view of two multilevel electric devices joined together according to the present invention.

The methods described in this application can be used to produce a multilevel flex circuit that has a thickness on the order of 25 micrometers, among other possible embodiments. Referring to FIG. 7, a more complex circuit can be formed by joining together two or more multilevel flex circuits 160A and 160B with an adhesive layer 312. As the traces of conductive material 170 are buried, the adhesion is not complicated by traces that protrude upwardly from the surfaces of the dielectric substrates 162, as described in the Background section for prior art processes.

The terms and expressions which have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims which follow. In particular, the word "machining" should be taken to include all methods for removing material from a substrate, including the use of an energy beam, such as a laser, and etching. There are many different forms of etching including mechanical, chemical, plasma or directed energy beam etching, all of which are included in the term "machining".

What is claimed is:

1. A method of producing a multilevel electronic device comprising:
    (a) providing a substrate of dielectric material having a set of surfaces;
    (b) machining into said substrate from a said surface, thereby creating a set of first indentations, at a first level;
    (c) depositing conductive material into said first indentations to create a set of first conductive features;
    (d) substantially filling said first indentations with dielectric material;
    (e) machining again into said substrate from a said surface, thereby creating a set of second indentations, at a second level; and
    (f) depositing conductive material into said second indentations to create a set of second conductive features.

2. The method of claim 1, wherein step (e) further includes machining, in at least one place, to said first level, thereby together with step (f) constructing at least one electrical connection between said first set of conductive features and said second set of conductive features.

3. The method of claim 1, further comprising:
    (a) machining again into said substrate and machining a via that intersects both a said first conductive feature and a said second conductive feature; and
    (b) depositing conductive material into said via to electrically connect said first conductive feature to said second conductive feature.

4. The method of claim 1, wherein said first set of indentations and said second set of indentations are both machined in from a single major surface.

5. The method of claim 1, wherein said at least one major surface includes a first major surface and a second major surface and wherein said first set of indentations is machined in from said first major surface and said second set of indentations is machined in from said second major surface.

6. The method of claim 1, wherein said machining of said second level indentations includes removal of some of said dielectric material.

7. The method of claim 1, further including, prior to step (b), the step of coating said major surface of said substrate of dielectric material with process-removable material, so that when step (b) is performed said machining removes said process-removable material at said first indentations.

8. The method of claim 1, wherein a conductive seed layer is deposited over said major surface by sputtering, but is removed everywhere but in said indentations by exposing said major surface of said substrate to a removal process.

9. The method of claim 1, wherein said step (d) includes filling said first indentations with liquid, curable material and then curing said liquid, curable material to form a filling of substantially solid, dielectric material.

10. The method of claim 1, wherein said step (d) more specifically includes plasma depositing dielectric material into said first indentations.

11. The method of claim 1, wherein said step (d) more specifically includes filling said first indentations with paralyne by way of sublimation.

12. The method of claim 1, further including laminating said flexible multilevel electrical device to a second flexible electrical device, to form a new multilevel electrical device having an increased number of levels.

* * * * *